(12) United States Patent
Kim

(10) Patent No.: US 7,593,116 B2
(45) Date of Patent: Sep. 22, 2009

(54) APPARATUS AND METHOD FOR DETECTING ERROR OF TRANSFER SYSTEM

(75) Inventor: Sang Gyu Kim, Gumi-si (KR)

(73) Assignee: LG. Display Co., Ltd., Seoul (KR)

( * ) Notice: Subject to any disclaimer, the term of this patent is extended or adjusted under 35 U.S.C. 154(b) by 336 days.

(21) Appl. No.: 11/449,232

(22) Filed: Jun. 8, 2006

(65) Prior Publication Data

US 2007/0146690 A1 Jun. 28, 2007

(30) Foreign Application Priority Data

Dec. 28, 2005 (KR) ............ 10-2005-0132274

(51) Int. Cl.
*G01B 11/14* (2006.01)
(52) U.S. Cl. ............... 356/614; 356/445
(58) Field of Classification Search ............ 356/237.2, 356/400, 445–448, 614–615
See application file for complete search history.

(56) References Cited

U.S. PATENT DOCUMENTS

2005/0166744 A1* 8/2005 Berge et al. ............... 83/879
2006/0153603 A1* 7/2006 Nishikawa et al. ......... 399/301

* cited by examiner

*Primary Examiner*—Tarifur Chowdhury
*Assistant Examiner*—Michael Lapage
(74) *Attorney, Agent, or Firm*—Brinks Hofer Gilson & Lione

(57) ABSTRACT

An apparatus is disclosed for detecting error in a transfer system for transferring a substrate loaded upon fabricating of a liquid crystal display device of a flat panel display device. In an apparatus for detecting error of the transfer system, a test substrate includes reflective marks arranged symmetrically on both sides. An emitter generates light to radiate onto the transferring test substrate. A receiver receives light reflected from the reflective marks of the test substrate. A controller detects any error of the transfer system on the basis of the reflective times received by the receiver. A display displays any errors in the transfer system detected by the controller.

15 Claims, 12 Drawing Sheets

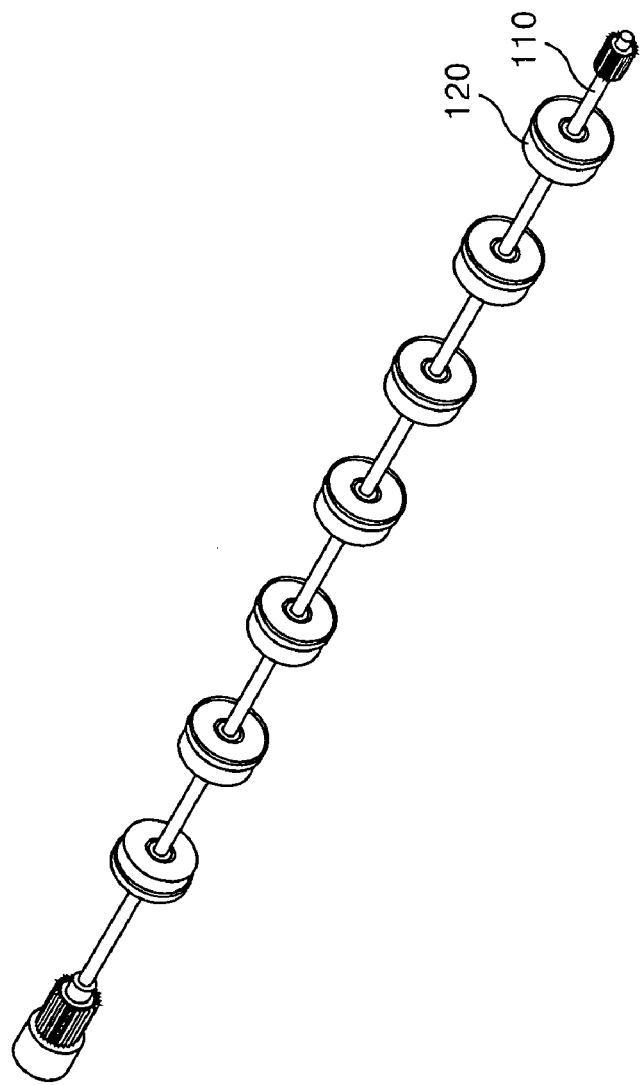

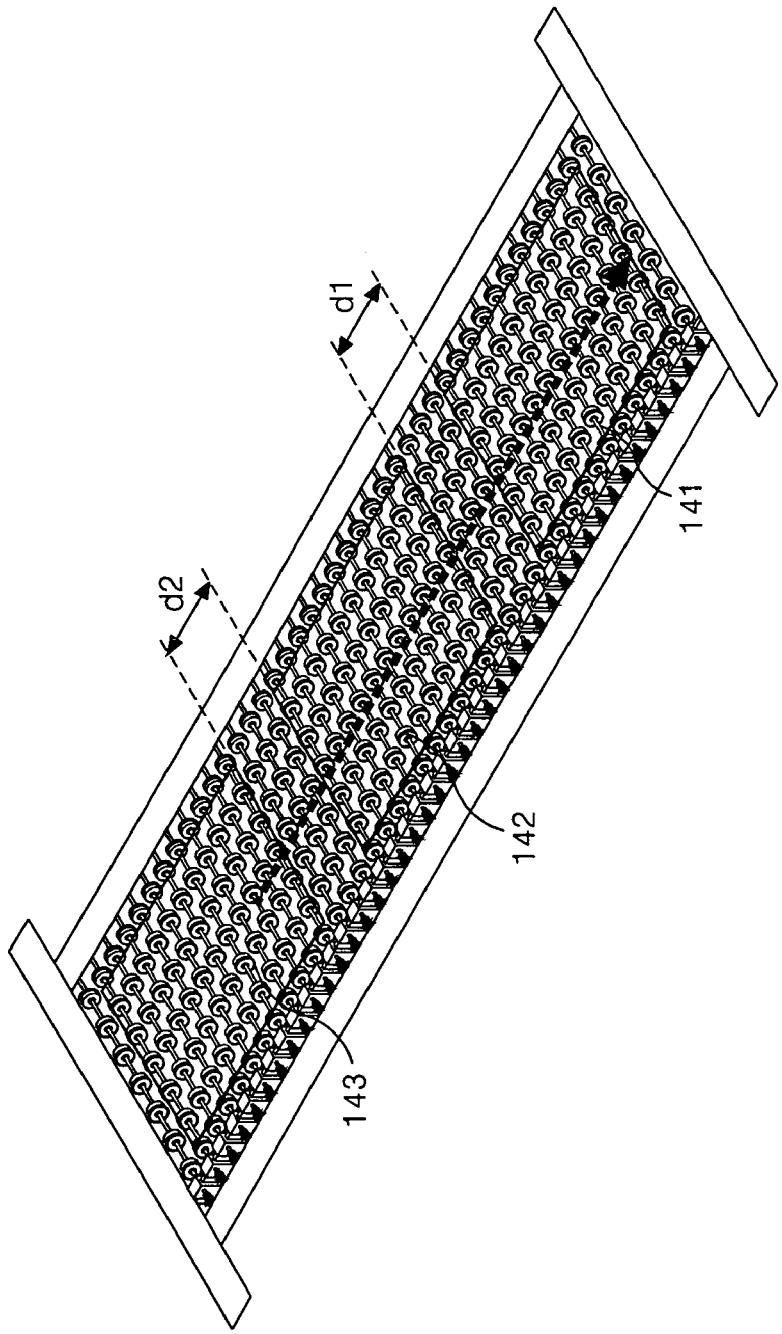

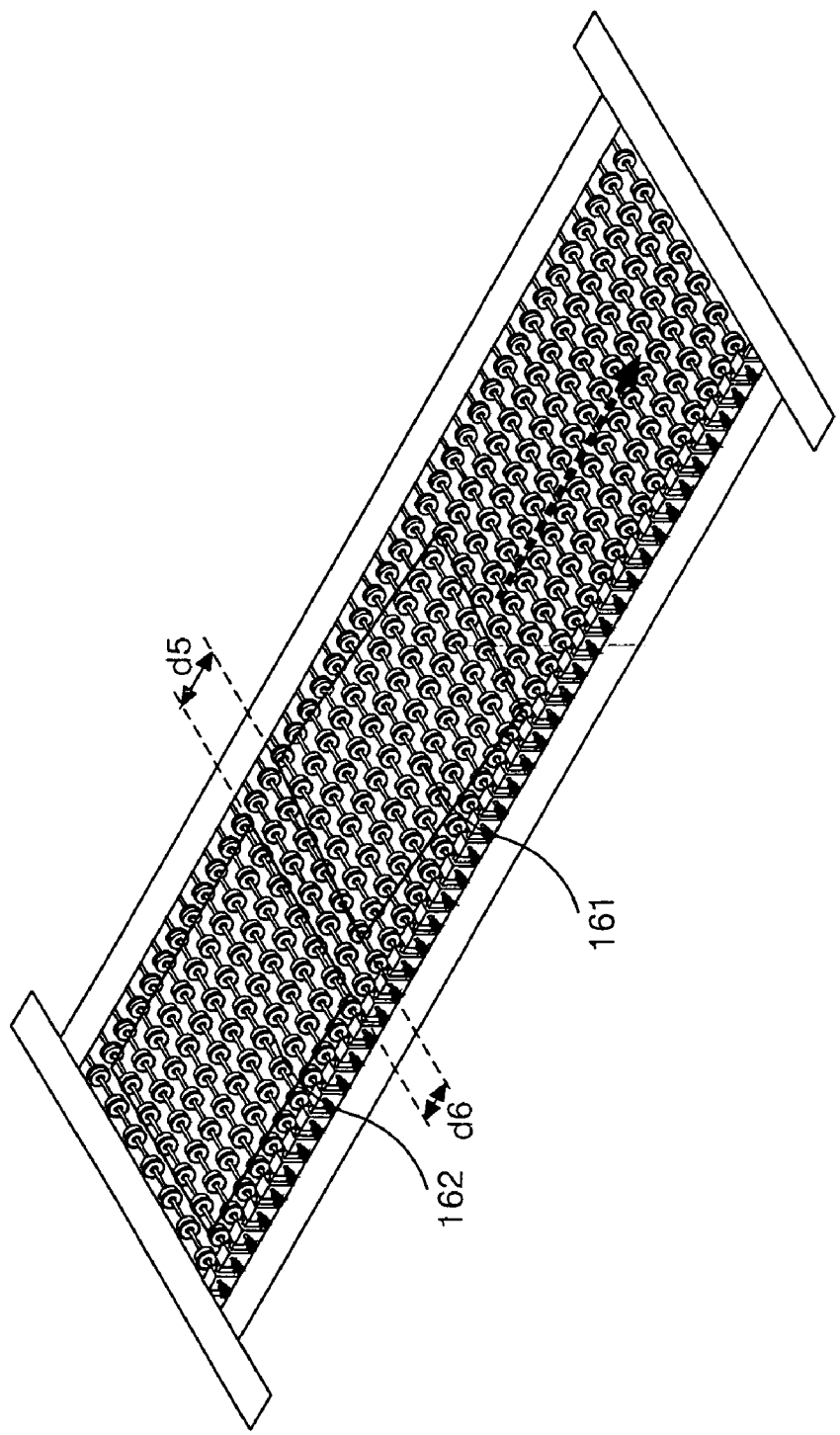

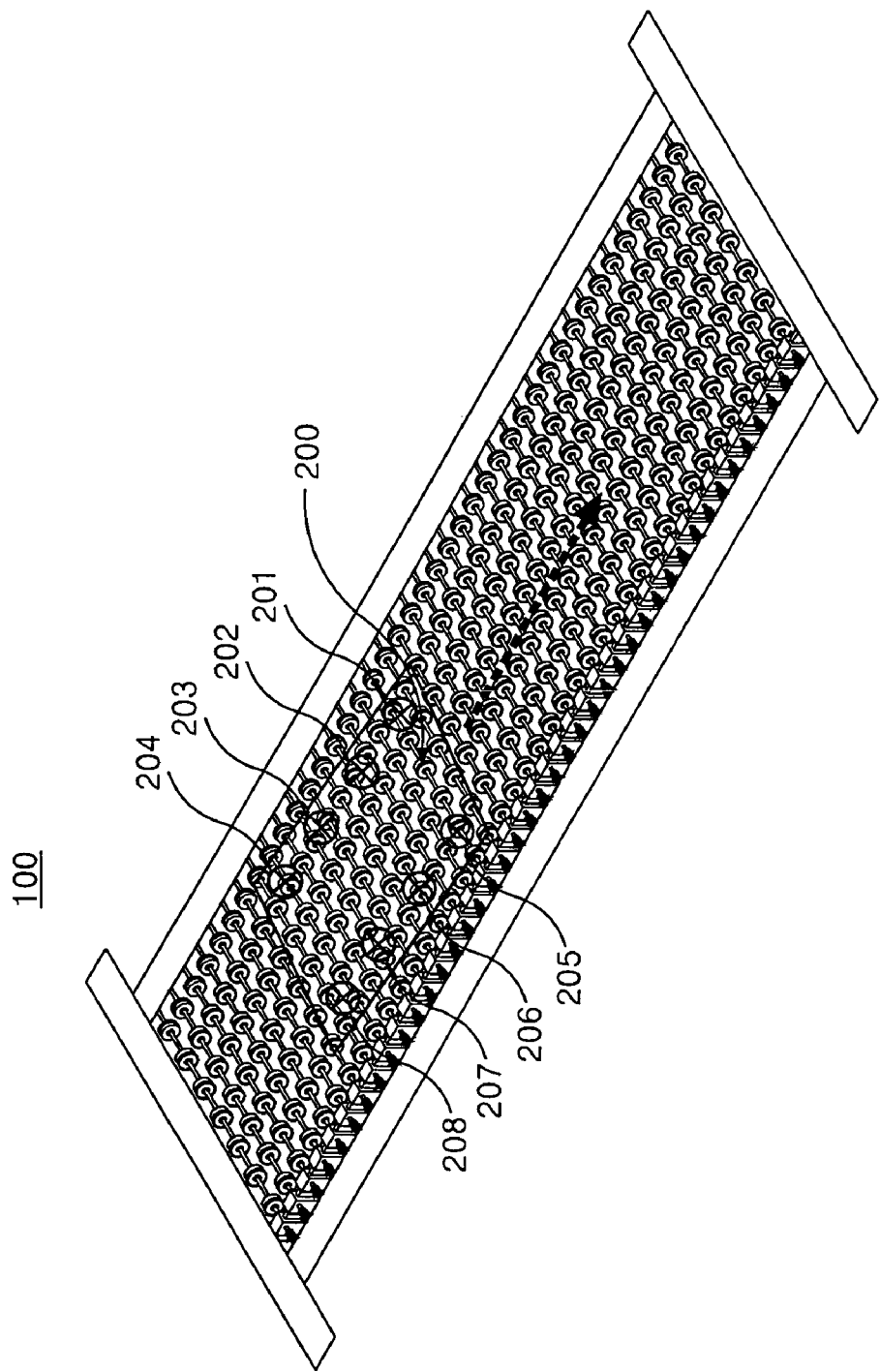

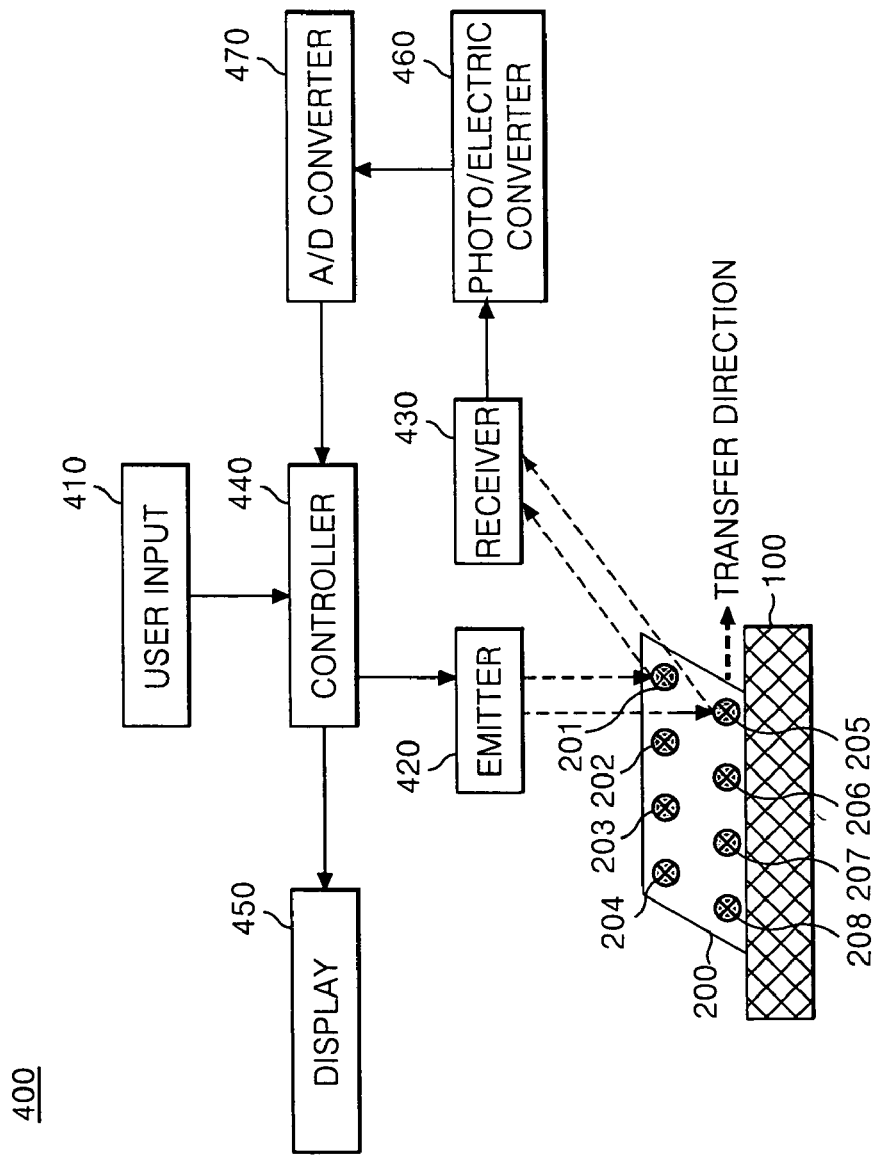

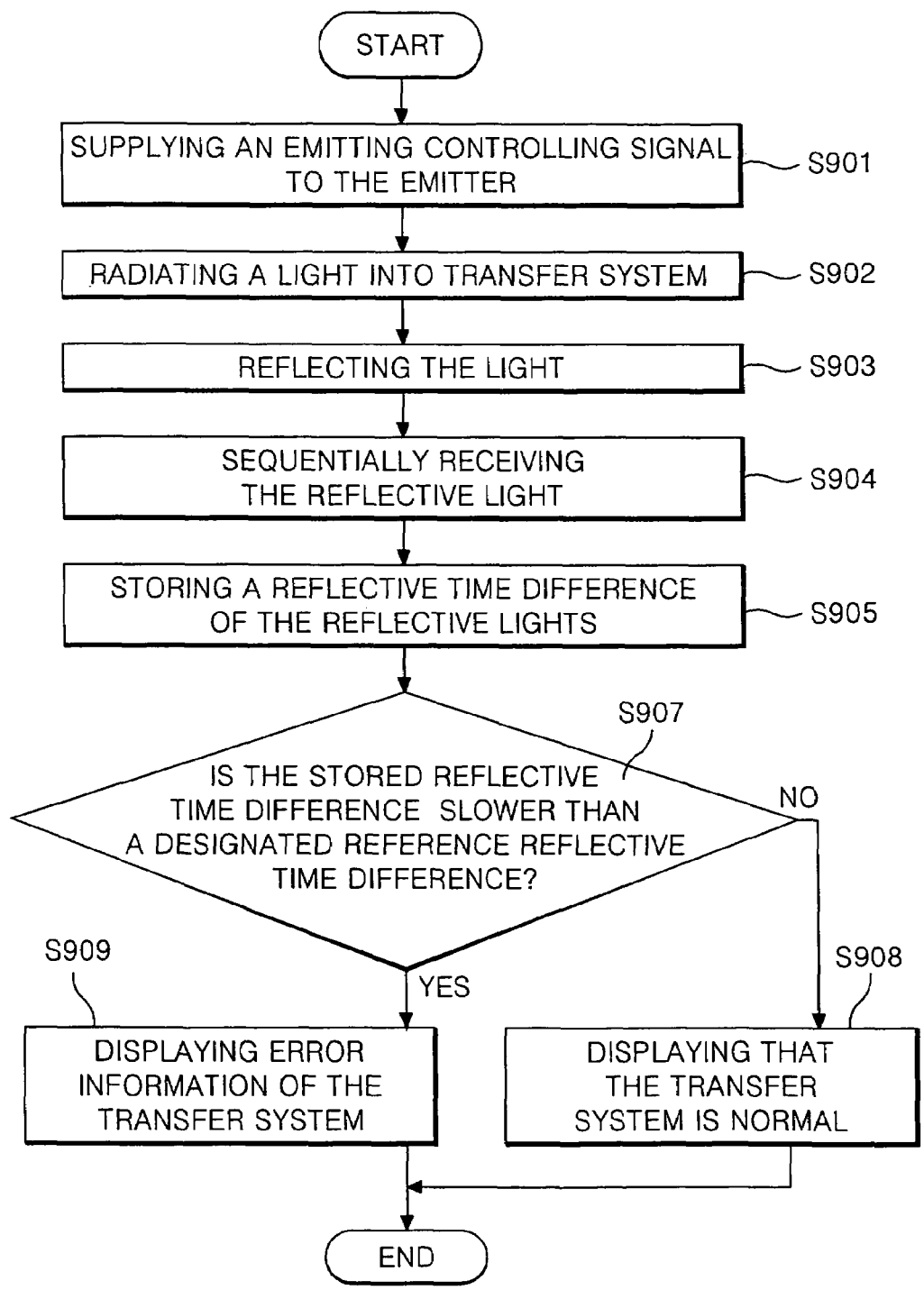

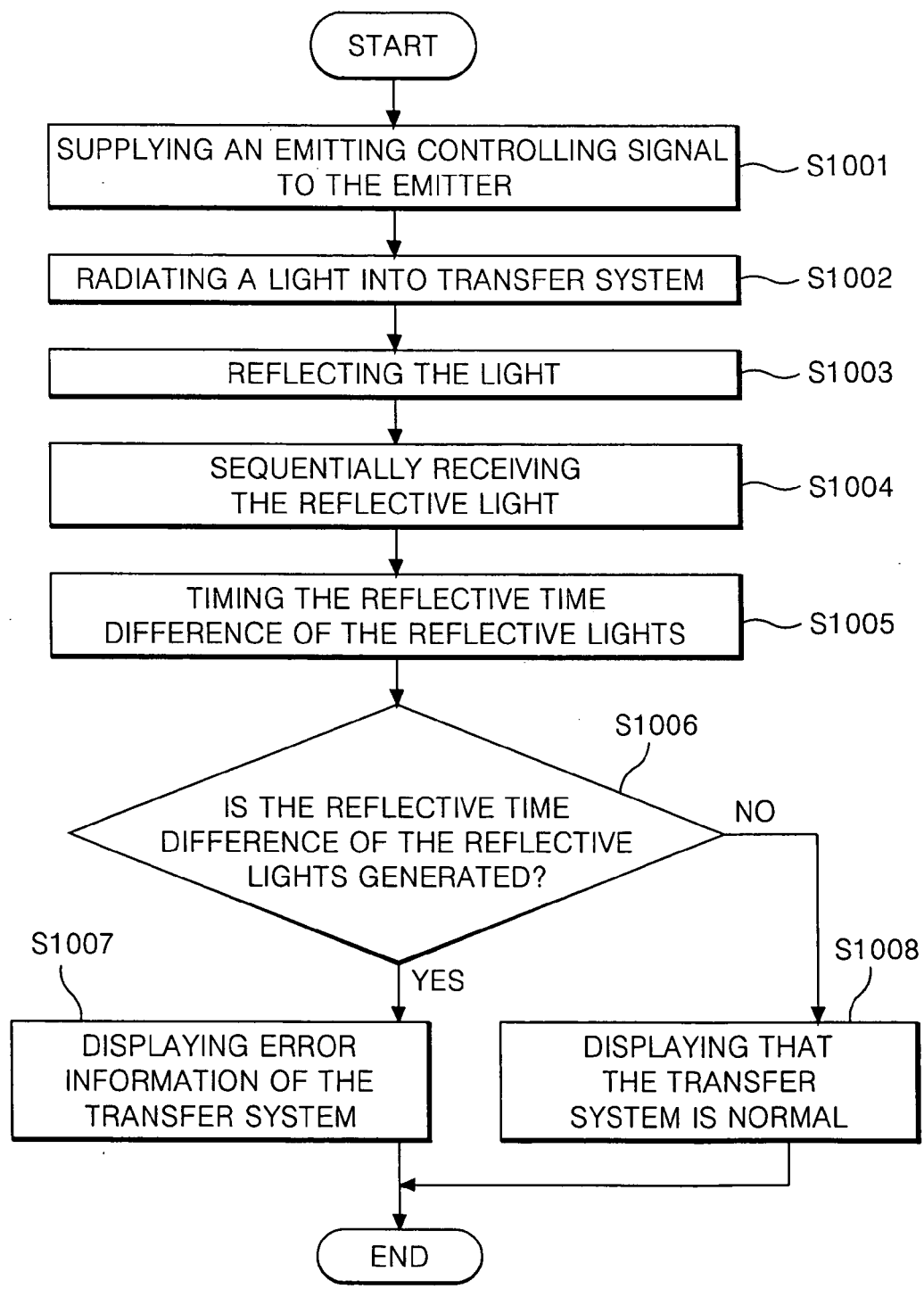

APPARATUS AND METHOD FOR DETECTING ERROR OF TRANSFER SYSTEM

This application claims the benefit of Korean Patent Application No. P2005-0132274 filed in Korea on Dec. 28, 2005, which is hereby incorporated by reference.

BACKGROUND

This disclosure relates to a flat panel display device including a liquid crystal display device, etc., and specifically to an apparatus and a method for detecting error of a transfer system that are adaptive for detecting an error of a transfer system transferring a substrate loaded upon the fabricating of a liquid crystal display device with a flat panel display device.

DESCRIPTION OF RELATED ART

Recently, display devices have become very important as a visual information communicating medium in today's information society. There is an increased problem in current displays, such as the Cathode Ray Tube, which has a heavy weight and a bulky volume. Flat panel display devices have been developed to decrease the size and volume of displays. Flat panel display devices include a liquid crystal display device ("LCD"), a field emission display ("FED"), a plasma display panel ("PDP") and an electro-luminescence ("EL"), etc., and most of them are utilized and marketed.

The liquid crystal display device has a small thickness and is light-weight. LCD's improve productivity and are rapidly replacing the cathode ray tube in many applications. Specifically, an LCD device of an active matrix type for driving a liquid crystal cell using a thin film transistor ("TFT") has the advantage of high picture quality and small power consumption, and therefore, have been rapidly developed as a result of mass production techniques and increased research and development.

Referring to FIG. 1, the liquid crystal display device of the active matrix type includes a color filter array substrate 22 and a TFT array substrate 23 that are coupled with one another with a liquid crystal layer 15 therebetween. The liquid crystal display device shown in FIG. 1 shows one portion of a whole screen.

A black matrix (not shown), a color filter 13 and a common electrode 14 are located on a back side of an upper glass substrate 12 are formed at the color filter substrate 22. A polarizer 11 is attached on a front side of the upper glass substrate 12. The color filter 13 includes a red R, a green G and a blue B color filter and transmits a visible ray having a specific wavelength bandwidth to implement a color display.

In the TFT array substrate 23, data lines 19 and gate lines 18 cross each other on a front side of the lower glass substrate 16, and the TFTs 20 are formed at an intersection thereof. On the front surface of the lower glass substrate 16, a pixel electrode 21 is formed at a cell area between the data line 19 and the gate line 18. The TFT 20 switches a data transmitting path between the data line 19 and the pixel electrode 21 in response to a scanning signal from the gate line 18 to drive the pixel electrode 21. The polarizer 17 is attached at the back side of the TFT array substrate 23.

A liquid crystal layer 15 controls a light transmitted via the TFT array substrate 23 through an electric field applied to the liquid crystal layer 15. The polarizers 11 and 17 attached on the color filter substrate 22 and the TFT substrate 23, respectively, allow light polarized in any one direction to be transmitted. A polarizing direction is crossed when the liquid crystal 15 is 90° TN mode. An alignment film (not shown) may be formed on liquid crystal opposing surfaces of the color filter substrate 22 and the TFT substrate 23.

A method of fabricating a liquid crystal display device of the active matrix type is classified into a substrate cleaning, a substrate patterning process, an alignment forming/rubbing process, a substrate joining/ injecting process, a packing process, an inspecting process, or a repairing process. The substrate cleaning process removes an impurity contaminating a substrate surface of the liquid crystal display device by using a cleaning solution. The substrate patterning process is divided into a patterning of a color filter array substrate and a patterning of a TFT-array substrate. In the alignment forming/rubbing process, an alignment film is coated on each color filter array substrate and TFT array substrate, and the alignment film is rubbed by a rubbing patch. In the substrate joining/injecting process, the color filter substrate and the TFT array substrate are joined to each other by a sealant, and a liquid crystal and a spacer are injected through a liquid crystal injection port. Next, the liquid crystal injection port is sealed. In the packing process of a liquid crystal display panel, a tape carrier package ("TCP") is packed with an integrated circuit, a gate drive integrated circuit, and a data drive integrated circuit, which is connected to a pad portion on the substrate. The drive integrated circuit can be directly packed on the substrate by a Tape Automated Bonding type using the above-mentioned TCP or a Chip On Glass ("COG") type. The inspecting process includes an electrical inspection processed after a signal wiring such as a data line and a gate line, etc., and a pixel electrode is formed on the TFT array substrate. The electrical inspection and a naked eye inspection is processed after the substrate joining/injecting process. The repairing process is a restoration of a substrate provided that a repairing is enabled by the inspecting process. On the other hand, a non-repaired substrate in the inspecting process is disposed.

In fabricating most flat panel display device including the LCD device, a thin film material disposed on the substrate is patterned with a photolithography process, and the photolithography process consists of a photo process including coating a photo-resist, a mask alignment, an exposure, a development and a cleaning. Once the photolithography process is completed, the substrate is transferred into another chamber for an etching and a stripping process by a transfer system. Specifically, the transfer system for transferring the substrate from one chamber to another chamber upon the fabricating of the flat panel display device is used for a variety of species. For example, referring to FIG. 2 and FIG. 3, a transfer system may include a roller and a shaft.

Referring to FIG. 2, a transfer system 100 includes a plurality of shafts 110 arranged to have a uniform or constant spaced distance on the same plane. The transfer system 100 further includes plurality of rollers 120 fixed to have a uniform or constant spaced distance on the shaft 110. The plurality of shafts 110 are supplied with a predetermined rotatory strength and rotate having a constant velocity to allow a glass substrate 130 loaded on the transfer system 100 to be transferred.

Referring to FIG. 3, a plurality of rollers 120 are formed as a disk type, and are fixed on the shaft 110 by passing through the shaft 110 via a center portion of the disk type rollers. The plurality of rollers 120 are fixed on the shaft 110, so that the glass substrate 130 loaded on the transfer system 100 is not in contact with the shaft 110, but is directly contacted with the rollers 120. Accordingly, if the rollers 120 rotate along with the shaft 110, a frictional force between the rollers 120 and the glass substrate 130 is generated, and the frictional force becomes kinetic energy for transferring the glass substrate 130.

Referring to FIG. 4A, if the transfer system 100 in its normal state transfers the glass substrates 141, 142, and 143 without error, then the glass substrates 141, 142, and 143 are transferred with a uniform distance between the substrates. In other words, a distance d1 between adjacent glass substrates 141 and 142, and a distance d2 between adjacent glass substrates 142 and 143 should be equal. If the transfer system 100 is operating in its normal state without an error, the distances d1 and d2 are the same for all the glass substrates on the transfer system 100.

The flat panel display devices have tended to increase in size to result in larger viewing areas. As a result, the size of the glass substrate is also increased. Thus, the shaft 110 length of the transfer system 100 for loading and transferring the large glass substrate is lengthened. The shaft 110 length of the transfer system 100 may correspond with the size of the glass substrate that is passed with the transfer system 100. When the shaft 110 is lengthened, the size and weight of the glass substrate is also increased, resulting in a potential problem that the shaft 110 may become distorted and transformed by the weight of the glass substrate.

Referring to FIG. 4B, if a frictional force between the rollers 120 and the transferring glass substrates 151, 152 and 153 is uniformly changed by an error in the transfer system 100, the transferring glass substrates 151, 152 and 153 will not maintain a uniform distance between them. In other words, a distance d3 between adjacent glass substrates 151 and 152, and a distance d4 between adjacent glass substrates 152 and 153 may be different from one another if there is an error in the transfer system 100. The error may be caused by increased friction between one of the substrates and the rollers 120.

Referring to FIG. 4C, if a frictional force between the rollers 120 and the transferring glass substrates 161 and 162 is changed by an error in the transfer system 100, the transferring glass substrates 161 may buckle from a normal position. Accordingly, the edge distances d5 and d6 between adjacent glass substrates 161 and 162 may be different. If the distances d5 and d6 are different from one another, that is an indication that the transfer system 100 is not in its normal state and an error has occurred in transferring glass substrates 161 and 162.

An error is generated in the transfer system 100, when the transferring glass substrates are not maintained with a uniform distance or if the substrates are buckled. These errors may generate a plurality of problems such that a glass substrate may be broken or damaged upon transferring. For example, if a wet-etching process using a track means is used, the flatness of the glass substrate may not be maintained, so that it becomes difficult to uniformly maintain and manage the glass substrates.

BRIEF SUMMARY

In a first aspect, an apparatus for detecting error in a transfer system includes a test substrate on which a plurality of reflective marks are arranged. The test substrate is transferred on the transfer system. An emitter generates and radiates a light onto the test substrate. A receiver receives reflected light from at least one of the plurality of reflective marks on the test substrate. A controller is coupled with the receiver to detect an error in the transfer system based on a reflective time difference of the reflected light received by the receiver. The controller may be configured to output the detected error. The output may be to a display is coupled with the controller that displays the error of the transfer system detected by the controller.

In a second aspect, an apparatus for detecting error in a transfer system includes a test substrate with a plurality of reflective marks. The test substrate is transferred on the transfer system. An emitter generates and radiates a light onto the test substrate. A receiver receive the light reflected from at least one of the plurality of reflective marks. A controller is coupled with the receiver to detect an error in the transfer system based on a reflective time difference of the reflective light received by the receiver. The controller may be configured to output the detected error. The output may be to a display is coupled with the controller that displays the error of the transfer system detected by the controller.

In a third aspect, a method detects error in a transfer system. A light is radiated into a plurality of reflective marks, wherein the plurality of reflective marks are arranged on a test substrate with adjacent reflective marks configured to reflect the light sequentially. The light is received after being reflected by the adjacent reflective marks. An error is detected in the transfer system based on a reflective time difference of the reflected light from the adjacent reflective marks. The error detecting result is then outputted. The output may be a display.

In a fourth aspect, a method for detecting error in a transfer system is disclosed. A light is radiated into reflective marks arranged symmetrically on sides of a substrate wherein the substrate includes at least one of the reflective marks on each side of the substrate. The reflective marks are arranged to have a similar distance between adjacent reflective marks on the opposite side of the substrate. The substrate is transferred by the transfer system. The light is received after being reflected by the reflective marks. An error is detected in the transfer system based on a reflective time difference of the light reflected by the reflective marks arranged in symmetry with both sides. The error detected for the transfer system is then outputted. The output may be to a display.

BRIEF DESCRIPTION OF THE DRAWINGS

FIG. 3 is a perspective view showing a roller and a shaft included in a related art transfer system;

FIG. 4A is a perspective view of a related art transfer system transferring glass substrates;

FIG. 4B and FIG. 4C are perspective views of a related art transfer system transferring glass substrates;

FIG. 7 is a perspective view showing the transfer system with a test substrate according to one embodiment;

FIG. 8 is a diagram of an error detecting apparatus of the transfer system according to another embodiment;

FIG. 9 is a flow chart showing a method of detecting error of the transfer system according to the first embodiment; and FIG. 10 is a flow chart showing a method of detecting the error of the transfer system according to another embodiment.

DETAILED DESCRIPTION OF THE EMBODIMENTS

Hereinafter, the preferred embodiments of the present disclosure will be described in detail with reference to the accompanying drawings.

Figure 5:
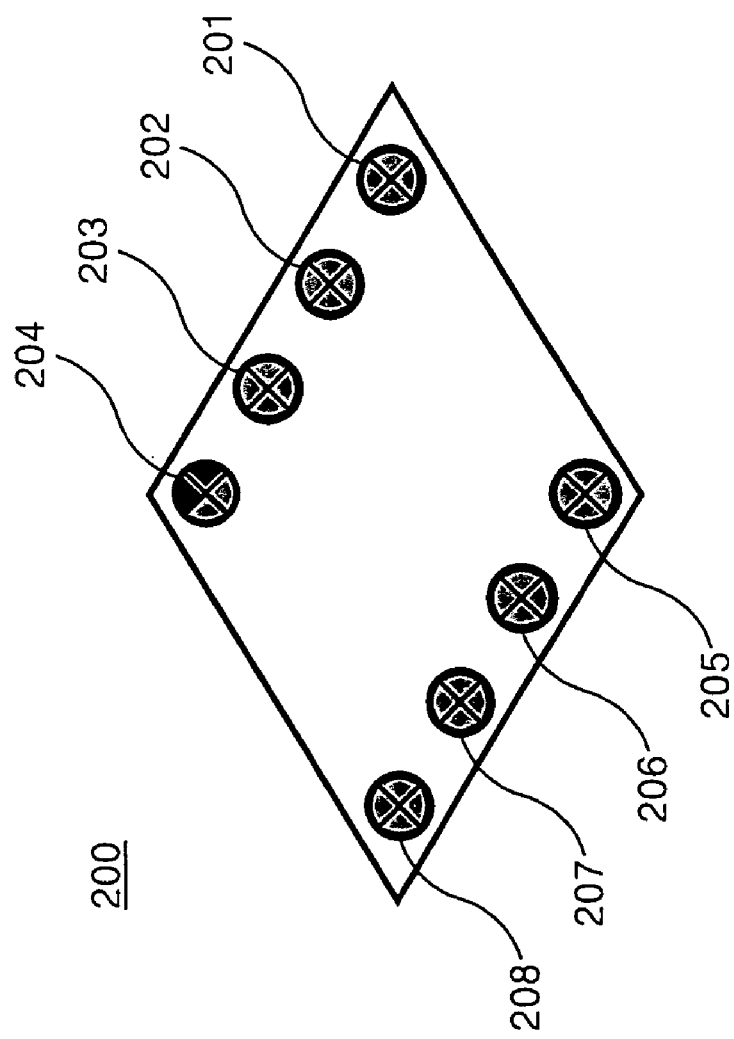
FIG. 5 is a perspective view showing a test substrate used in an error detecting apparatus of the transfer system according to one embodiment.

FIG. 5 is a perspective view showing a test substrate used in an error detecting apparatus of the transfer system according to one embodiment. Referring to FIG. 5, a test substrate 200 is shown according to one embodiment. A plurality of reflective marks 201 to 208 are arranged symmetrically on both sides. First to fourth reflective marks 201 to 204, and fifth to eighth reflective marks 205 to 208 are arranged symmetrically on either side. The test substrate 200 includes eight reflective marks 201 to 208. However, in alternate embodiments, the number of the reflective marks and the arrangement on the test substrate 200 may vary.

Figure 6:
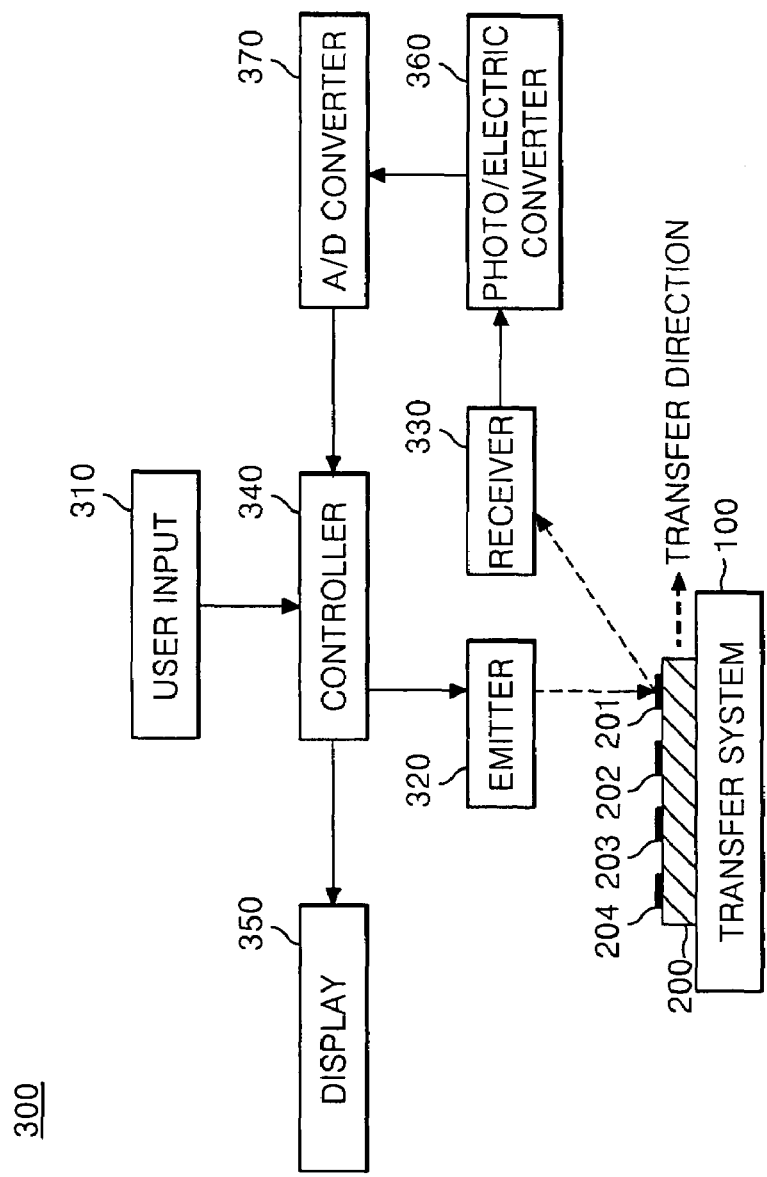
FIG. 6 is a diagram showing an error detecting apparatus of the transfer system according to a first embodiment.

FIG. 6 is a diagram showing an error detecting apparatus of a transfer system according to a first embodiment. Referring to FIG. 6, an apparatus 300 for detecting an error of the transfer system 100 may include a test substrate 200 in which a plurality of reflective marks are arranged symmetrically on the test substrate. In this embodiment, there are four reflective marks 201-204 shown on the glass substrate 200. In alternate embodiments, there may be more or fewer reflective marks that are arranged in a different manner.

The apparatus further includes a user input part 310 for inputting a user command regarding error detection of the transfer system 100; an emitter 320 generates light to radiate into the test substrate 200 transferred into the transfer system 100; a receiver 330 for receiving the light reflected from the reflective marks of the test substrate 200; a controller 340 detects error of the transfer system based on the time difference from when the reflective light is received by the receiver 330; and a display part 350 for displaying the error of the transfer system 100 detected by the controller 340. One embodiment may further include a photo/electric converter 360 for converting a light signal detected by the receiver 330 into an electric signal; and an A/D converter 370 for converting an analog electric signal converted by the photo/electric converter 360 into a digital electric signal.

The user input part 310 allows for inputting the user command indicating error detection of the transfer system 100. The user input 310 may be implemented as a button, a keyboard or a touch screen. In other words, the user initiates the displacement detection of the transfer system 100 with the controller 340 by using the user input 310.

If the emitter 320 is supplied with an emitting controlling signal indicating the emission from the controller 340, then a light is generated, which radiates into the test substrate 200 transferred with transfer system 100 shown in FIG. 7. The emitter 320 sequentially radiates light onto the reflective marks 201 to 204 which may be arranged to be symmetric on both sides. A frictional force between the rollers 120 and transferring glass substrates may be uniformly reduced using the detected error of the transfer system 100. Detection of the error may be used to determine that the transferred glass substrates are not maintained with a uniform distance. In other words, as in FIG. 4B, a po7int such that a distance d3 between the adjacent glass substrates 151 and 152 on the transfer system 100 and a distance d4 between the adjacent glass substrates 152 and 153 are differentiated is detected.

The error detection apparatus according to one embodiment may identify any errors in the glass substrates as they are transferred.

The receiver 330 receives the light reflected from the reflective marks of the test substrate 200. Since the test substrate 200 is transferred with the transfer system 100, the receiver 330 may be aligned with a single row of the reflective marks, or may be aligned with all the reflective marks, or only a subset of the marks. The receiver 330 may then output into the photo/electric converter 360. A photo/electric converting terminal converts a light signal received by the receiver 330 into the electric signal to output. For example, a photo diode may be implemented, such that the receiver 330 converts the received light signal into the electric signal to be implemented to directly output into the A/D converter 370. If the receiver 330 is implemented with a photo/electric converting terminal such as the photo diode, etc., and the controller 340 is implemented to have a signal system for processing the analog electric signal, the receiver 330 may convert the received light signal into an electric signal to be directly output into the controller 340.

The controller 340 is implemented to control the error detection of the transfer system 100 based at least in part on an input into the user input 310. In one example, if the power is turned-on, the controller 340 may be implemented to control the error detection of the transfer system 100 automatically. A method of detecting the error of the transfer system 100 in the controller 340 will now be described in detail.

First, if the controller 340 outputs an emitting controlling signal into the emitter 320 according to a user indication, the emitter 320 is driven by the electric signal to radiate the light into the test substrate 200. The test substrate 200 is transferred on the transfer system 100 shown in FIG. 7. The emitter 320 may sequentially radiate the light onto the reflective marks 201 to 204 arranged on a side of the test substrate 200.

If the radiated light is sequentially reflected by at least one of the first to fourth reflective marks 201 to 204 and received by the receiver 330, the controller 340 temporarily stores a time. In one example, the time is timed from the point that reflective light is radiated from the first reflective mark 201 is received to a point when the reflective light radiated by the second reflective mark 202 is received. In other words, the time is a reflective time difference of the reflective lights reflected by any adjacent reflective marks.

The controller 340 compares a temporarily stored reflective time difference with a designated reference reflective time difference. The designated reference reflective time difference is a reflective time difference from the adjacent reflective marks when the transferred glass substrates 141 to 143 are transferred with the same distance between them. When the distance d1 between adjacent glass substrates 141 and 142 and the distance d2 between adjacent glass substrates 142 and 143 are equally maintained as shown in FIG. 4A, the designated reference reflective time difference is the difference between the reflection from adjacent reflective marks.

If the temporarily stored reflective time difference and the designated reference reflective time difference are the same, the controller 340 knows that the transferred glass substrates 141 to 143 are transferred to have the same distance between them and are in a normal state. An error is not generated at the transfer system 100 in this scenario and a display may show a normal state of the transfer system 100 into the display 350 shown in FIG. 4A.

In an alternate embodiment, the display may be replaced with a different external device. The state of the system or the detected error may be output to an external device other than a display. As one example, the error may be outputted to the Internet, which may serve as a display. Alternatively, the output may be stored in an external storage device or in a computer. The output may occur in a number of different ways, with a display merely being one option. These alternative should be understood to be a part of the embodiments discussed herein even if the description refers to a display.

If the temporarily stored reflective time difference is greater than the designated reference reflective time difference, the controller 340 knows that the transferred glass substrates 151 to 153 are transferred without having the same distance between them. For example, if the temporarily stored reflective time difference is 3 sec and the designated reference reflective time difference is 2 sec then the glass substrates are not in a normal state with a consistent distance between them. Alternatively, it may be an indication that the substrates are not properly aligned on the transfer system 100. An error is generated at the transfer system 100 to display an error state of the transfer system 100 into the display part 350 shown in FIG. 4B if the time differences are not approximately the same. In one embodiment, there may be a threshold difference that is used to indicate an error. For example, if the time differences are more than 0.1 seconds different, then that indicates an error has occurred.

The photo/electric converter 360 converts light outputted from the receiver 330 into an electric signal to output the A/D converter 370. But, a photo/electric converting terminal for converting a light signal received from the receiver 330 into an electric signal to output may be implemented as a photo diode. A photo/electric converter 360 may not be required. The electric signal may be converted by the receiver 330 and directly inputted into the A/D converter 370.

The A/D converter 370 converts an analog electric signal inputted from the photo/electric converter 360 into a digital electric signal. The converter may be adapting a signal system of the controller 340 to output into the controller 340. If the controller 340 is implemented to have a signal system for processing the analog electric signal, the A/D converter 370 may be an unnecessary component. The analog electric signal may be converted by the receiver 330 or the photo/electric converter 360 and directly inputted into the controller 340.

FIG. 8 is a block diagram of an error detecting apparatus of the transfer system according to another embodiment. Referring to FIG. 8, an apparatus 400 for detecting an error of the transfer system includes the test substrate 200 in which a plurality of reflective marks 201 to 208 are arranged symmetrically on both sides of the substrate 200. In one embodiment, as shown, the substrate 200 has two rows of four reflective marks symmetrically arranged on opposing sides of the substrate 200. The first row has reflective marks 201-204 and the second row has reflective marks 205-208. In alternate embodiments there may be a different number of reflective marks and they may be arranged differently.

The apparatus further includes: a user input 410 for inputting an user command regarding error detection of the transfer system 100; an emitter 420 that generates light to radiate into the test substrate 200; a receiver 430 for receiving the light reflected from the reflective mark(s) of the test substrate 200; a controller 440 to detect an error of the transfer system on the basis of the reflective time difference from the reflective lights received by the receiver 430; and a display part 450 for displaying the error of the transfer system 100 detected by the controller 440. One embodiment may further include a photo/electric converter 460 for converting a light signal detected by the receiver 430 into an electric signal; and an A/D converter 470 for converting an analog electric signal converted by the photo/electric converter 460 into a digital electric signal.

The user input part 410 allows for inputting the user command indicating error detection of the transfer system 100. The user input part 410 may be implemented as a button, keyboard or a touch screen. In other words, the user initiates the displacement detection of the transfer system 100 with the controller 440 by using the user input part 410.

Figure 1:
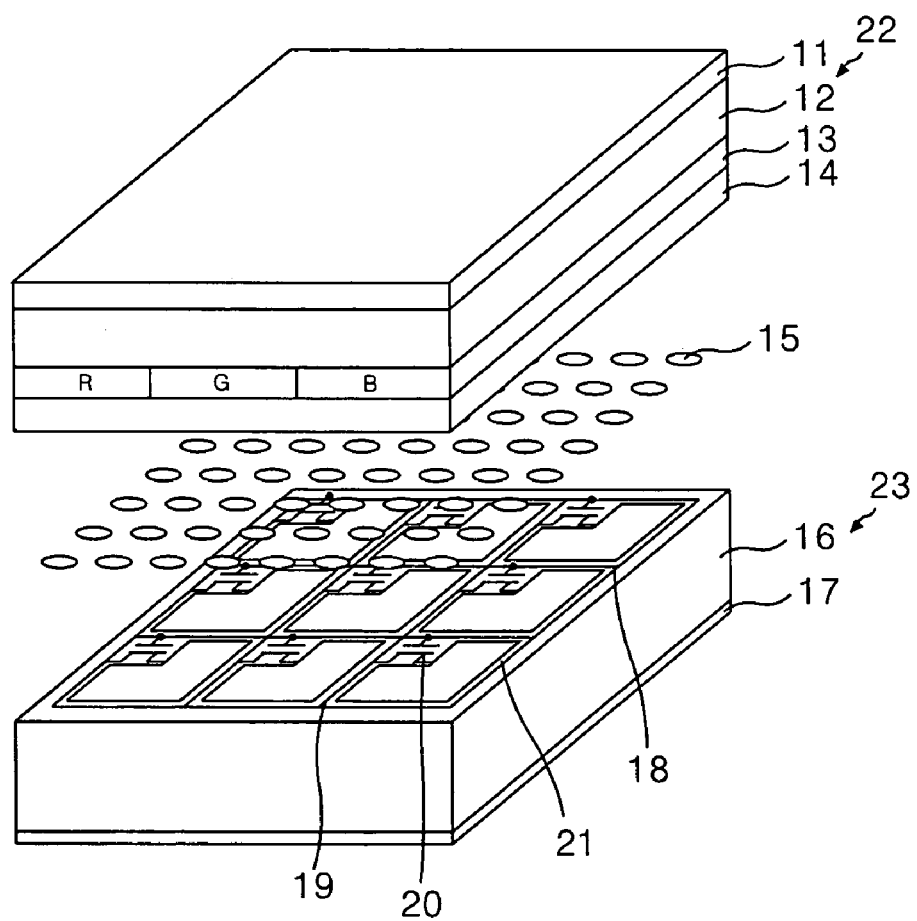
FIG. 1 is a perspective view showing a related art liquid crystal display device of an active matrix type.
Figure 2:
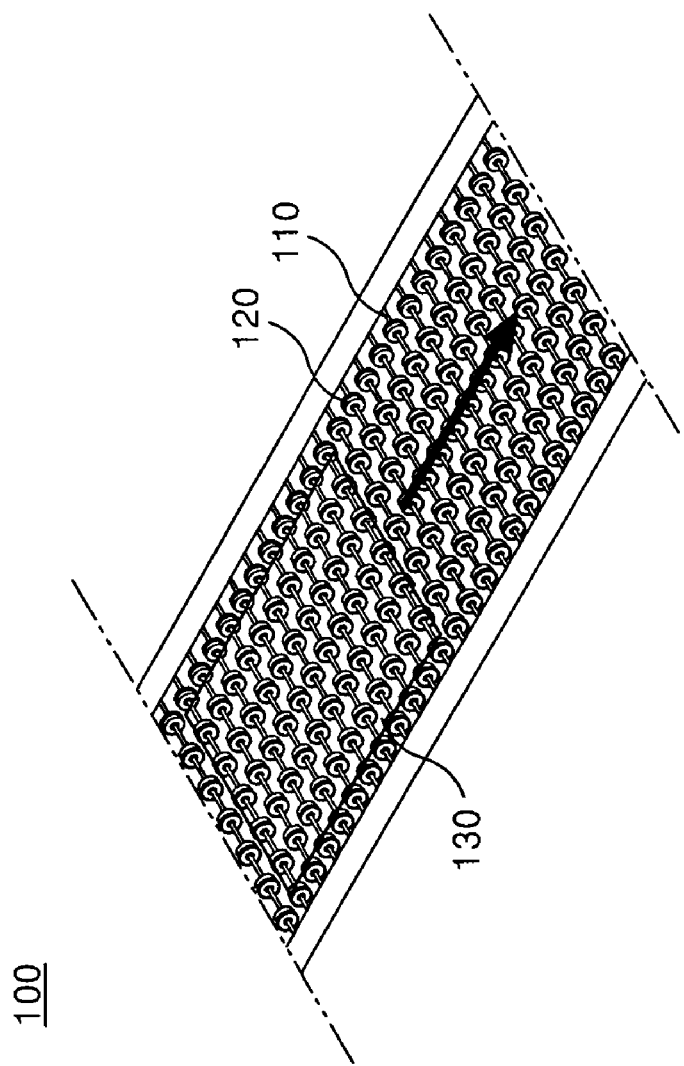
FIG. 2 is a perspective view showing a related art transfer system.
Figure 4B:
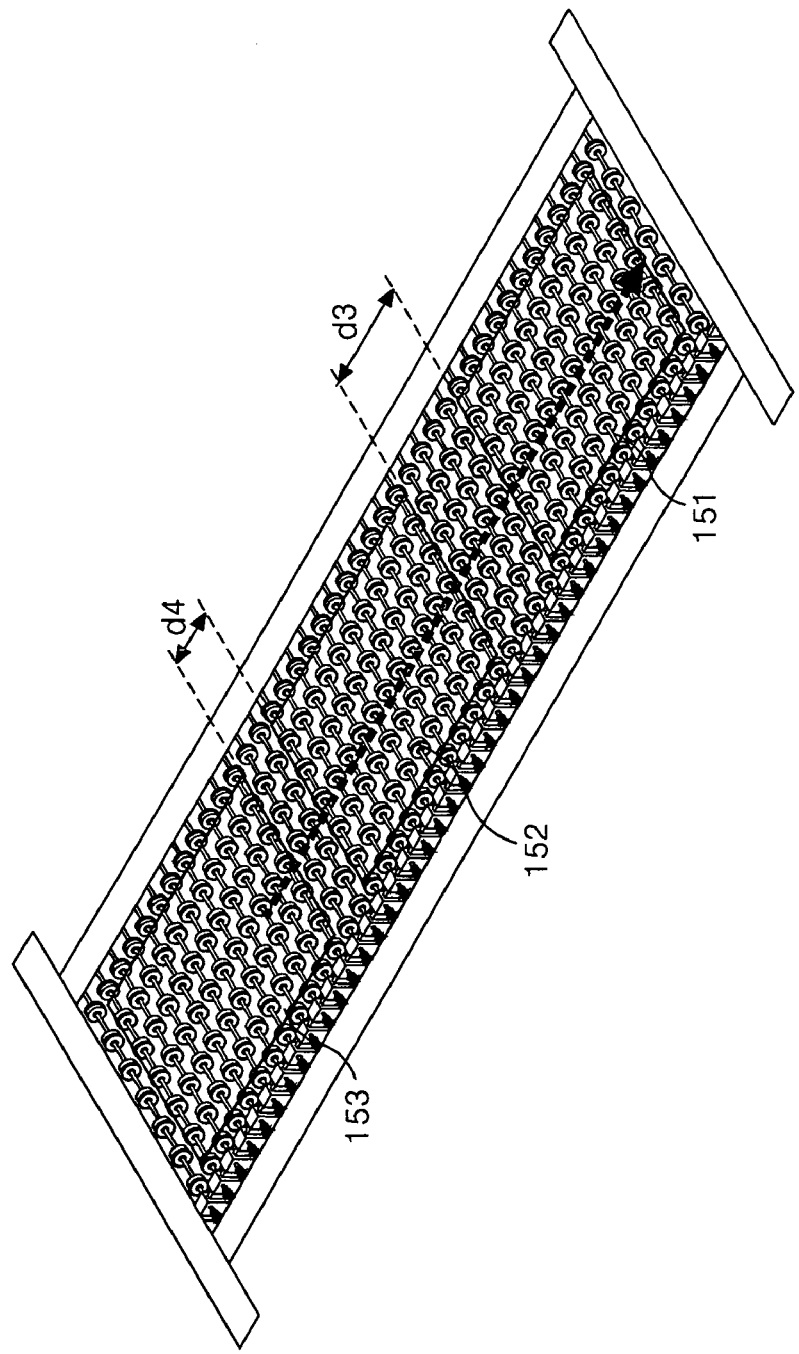

If the emitter 420 is supplied with an emitting controlling signal indicating the emission from the controller 440, then a light is generated, which radiates into the test substrate 200 transferred with the transfer system 100 as shown in FIG. 7. The emitter 420 sequentially radiates light onto the first to eighth reflective marks 201-208, which may be arranged with the same distance between them and symmetrically located on both sides of the test substrate 200. The light onto the first and fifth reflective marks 201 and 205 should arrive substantially simultaneously because they are arranged opposite one another on either side. If a frictional force between the rollers 120 and the transferring glass substrates 161 to 162 is modified by an error in the transfer system 100, then the light reflected by the first and fifth reflective marks 201 and 205 may not arrive substantially simultaneously. This error may be caused by the glass substrate not being properly aligned by being twisted. This error may be caused as shown in FIG. 4C when distances d5 and d6 are not uniform. This error may be detected based on the fact that the reflective light is not received when expected. In addition to twisting, another error would be improper spacing between substrates. In other words, if a distance d3 as in FIG. 4B between the adjacent glass substrates 151 and 152 is not the proper distance or is different than a related distance d4, then an error exists.

The receiver 430 receives the light reflected from the reflective mark(s) of the test substrate 200. Since the test substrate 200 is transferred with the transfer system 100, the receiver 430 receives the reflective light reflected by the reflective marks which are arranged in symmetry at both sides to output into the photo/electric converter 460. But, a photo/electric converting terminal converts the light signal received the receiver 430 into an electric signal to output. In one example, a photo diode may be implemented. The receiver 430 converts the received light signal into the electric signal to be implemented to directly output into the A/D converter 470. The receiver 430 may be implemented with a photo/electric converting terminal such as the photo diode, etc., and the controller 440 may be implemented to have a signal system for processing the analog electric signal. The receiver 430 may convert the received light signal into the electric signal to be implemented to directly output into the controller 440.

The controller 440 is implemented to control the error detection of the transfer system 100 based at least in part on a user input into the user input part 410. In one example, if the power is turned-on, the controller 440 may be implemented in such a manner to control the error detection of the transfer system 100 automatically. A method of detecting in the controller 440 the error of the transfer system 100 will be described in more detail.

If the controller 440 outputs an emitting controlling signal into the emitter 420 to indicate an emission according to a user indication, the emitter 420 is driven by the electric signal to radiate the light into the test substrate 200. The test substrate is transferred on the transfer system 100 as shown in FIG. 7. The emitter 420 may simultaneously radiate light onto the reflective mark(s) 201-208 which in one embodiment, are arranged symmetrically on both sides of the test substrate 200.

If the radiated light is sequentially reflected by the first to eighth reflective marks 201-208 and received by the receiver 430, the controller 440 times the reflective time difference of the reflective lights reflected from the first to eighth reflective marks 201-208. If the reflective time from the reflection from the first and fifth reflective marks 201 and 205 is different, the controller 440 knows that the transferred glass substrate 161 may be distorted from the normal position. In a normal position, the reflective time for each of the pairs of reflective marks 201 with 205, 202 with 206, 203 with 207 and 204 with 208 should be substantially the same. An error may occur if side distances d5 and d6 as shown in FIG. 4C between the adjacent glass substrates 161 and 162 are different. The error generation of the transfer system 100 may be displayed on the display part 450 as shown in FIG. 4C.

If the reflective time difference of the reflective lights reflected from the reflective marks is not generated, such that the reflective lights are equally received, the controller 440 knows that the transferred glass substrates 141 to 143 are transferred with a uniform distance. An error is not generated at the transfer system 100 and the normal state of the transfer system 100 may be displayed on a display part 450 shown in FIG. 4A.

The photo/electric converter 460 converts light outputted from the receiver 430 into the electric signal to output the A/D converter 470. But, a photo/electric converting terminal converting a light signal received the receiver 430 into the electric signal to output may be implemented as a photo diode. In that case the photo/electric converter 460 may not be implemented, and an electric signal converted by the receiver 430 is directly inputted into the A/D converter 470.

The A/D converter 470 converts an analog electric signal inputted from the photo/electric converter 460 into a digital electric signal adapting a signal system of the controller 440 to output into the controller 440. If the controller 440 is implemented with a signal system for processing the analog electric signal, the A/D converter 470 may not be implemented in one embodiment. An analog electric signal is converted by the receiver 430 and the photo/electric converter 460 is directly inputted into the controller 440.

According to one embodiment, there may be automatic detection of an error of the transfer system 100 transferring the loaded substrate upon fabricating of the liquid crystal display device and displays to prevent a damage of a substrate in a transferring process. Thus, it becomes possible to improve productivity of the product. An error detecting apparatus of the transfer system having such structure will be described with reference to a flowchart diagram of a process for detecting an error of the transfer system 100.

FIG. 9 is a flowchart showing a method of detecting an error of the transfer system according to a first embodiment. Referring to FIG. 9, a user may initiate the error detection of the transfer system 100, such that the controller 340 supplies an emitting controlling signal to the emitter 320 to indicate a light should be radiated (S901). The emitter 320 generates light corresponding to the emitting controlling signal to radiate into the transfer system 100 (S902). The emitter 320 radiates light into the transferred test substrate 200 of the transfer system 100. Specifically, the emitter 320 sequentially radiates the light onto reflective mark(s) which may be arranged as shown in FIG. 7.

If the radiated light is sequentially radiated by the first and second reflective marks 201 and 202 (S903), the receiver 330 sequentially receives the reflective light reflected by the first and second reflective marks 201 and 202 arranged in such a manner to have the same distance to allow the received light signal to be transmitted to the controller 340 (S904). If light radiated onto the test substrate 200 is reflected and received, the controller 340 temporarily stores a time that begins when reflective light is radiated from the first reflective mark 201 and is received until the point when the reflective light radiated by the second reflective mark 202 is received. The measured time is a reflective time difference of the reflective lights reflected by adjacent reflective marks (S905).

The controller 340 determines whether or not the temporarily stored reflective time difference is greater than the designated reference reflective time difference (S907). If the differences are the same, the controller 340 knows that the transferred glass substrates 141 to 143 are transferred in a normal state with no error. An error is not generated at the transfer system 100, which is displayed on the display part 350 shown in FIG. 4A (S908).

If the temporarily stored reflective time difference is greater than the designated reference reflective time difference, the controller 340 knows that the transferred glass substrates 151 to 153 are transferred without having the proper distance between them. This is an indication that there is an error. The error is generated at the transfer system 100 to display an error state of the transfer system 100 on the display part 350 shown in FIG. 4B (S909).

FIG. 10 is a flowchart showing a method of detecting the error of a transfer system according to another embodiment. Referring to FIG. 10, a user initiates or orders the error detection of the transfer system 100. The controller 440 supplies an emitting controlling signal to the emitter 420 to indicate a light radiating (S1001). The emitter 420 generates a light corresponding with the emitting controlling signal to radiate on the transfer system 100 (S1002). The emitter 420 radiates a light onto the transferred test substrate 200 of the transfer system 100. Specifically, the emitter 420 simultaneously radiates the light onto the first and fifth reflective marks 201 and 205 arranged symmetrically opposite one another on opposing sides of the test substrate 200 shown in FIG. 7.

If the radiated light is radiated by the first and fifth reflective marks 201 and 205 (S1003), the receiver 430 receives the reflective light reflected by the first and fifth reflective marks 201 and 205. The received light signal may then be transmitted to the controller 440 (S1004). If light radiated on the test substrate 200 is reflected and received, the controller 440 measures the reflective time difference between the reflective lights reflected from the first and fifth reflective marks 201 and 205 (S1005).

The controller 340 determines whether or not there is a reflective time difference of the reflective lights reflected from the first and fifth reflective marks 201 and 205 (S1006). The reflective time difference must be substantially different to suggest an error has occurred. If the reflective time difference does occur, the controller 440 knows that the transferred glass substrates 161 may be distorted from a normal position. In one embodiment, the erro is caused by the differentiation in the side distance d5 and d6 between the adjacent glass substrates 161 and 162. Any error generation may be displayed on a display part 450 as shown in FIG. 4C (S1007).

If the reflective time difference of the reflective lights reflected from adjacent reflective marks is not generated, the controller 440 knows that the transferred glass substrates 141 to 143 are transferred with a uniform distance. An error is not generated at the transfer system 100 and the normal state of the transfer system 100 is displayed on a display part 450 as shown in FIG. 4A (S1008).

The present embodiments detect an error of the transfer system transferring a loaded substrate upon fabricating the liquid crystal display device of the flat panel display device and displays to allow the user to be easily identified an error of the transfer system. Thus, it becomes possible to prevent damage of a substrate in a transferring process.

The illustrations of the embodiments described herein are intended to provide a general understanding of the structure of the various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. Additionally, the illustrations are merely representational and may not be drawn to scale. Certain proportions within the illustrations may be exaggerated, while other proportions may be minimized. Accordingly, the disclosure and the figures are to be regarded as illustrative rather than restrictive.

One or more embodiments of the disclosure may be referred to herein, individually and/or collectively, by the term "invention" merely for convenience and without intending to voluntarily limit the scope of this application to any particular invention or inventive concept. Moreover, although specific embodiments have been illustrated and described herein, it should be appreciated that any subsequent arrangement designed to achieve the same or similar purpose may be substituted for the specific embodiments shown. This disclosure is intended to cover any and all subsequent adaptations or variations of various embodiments. Combinations of the above embodiments, and other embodiments not specifically described herein, will be apparent to those of skill in the art upon reviewing the description.

The Abstract of the Disclosure is provided with the understanding that it will not be used to interpret or limit the scope or meaning of the claims. In addition, in the foregoing Detailed Description, various features may be grouped together or described in a single embodiment for the purpose of streamlining the disclosure. This disclosure is not to be interpreted as reflecting an intention that the claimed embodiments require more features than are expressly recited in each claim. Rather, as the following claims reflect, inventive subject matter may be directed to less than all of the features of any of the disclosed embodiments. Thus, the following claims are incorporated into the Detailed Description, with each claim standing on its own as defining separately claimed subject matter.

The above disclosed subject matter is to be considered illustrative, and not restrictive or limiting, and the appended claims are intended to cover all such modifications, enhancements, and other embodiments, which fall within the true spirit and scope of the present invention. Thus, to the maximum extent allowed by law, the spirit and scope of the present invention is to be determined by the broadest permissible interpretation of the following claims, including all equivalents, and shall not be restricted or limited by the foregoing detailed description.

To clarify the use in the pending claims and to hereby provide notice to the public, the phrases "at least one of <A>, <B>, ... and <N>" or "at least one of <A>, <B>, ... <N>, or combinations thereof" are defined by the Applicant in the broadest sense, superseding any other implied definitions hereinbefore or hereinafter unless expressly asserted by the Applicant to the contrary, to mean one or more elements selected from the group comprising A, B, ... and N, that is to say, any combination of one or more of the elements A, B, ... or N including any one element alone or in combination with one or more of the other elements which may also include, in combination, additional elements not listed.

What is claimed is:

1. An apparatus for detecting error in a transfer system, comprising:

a test substrate on which a plurality of reflective marks are arranged, the test substrate being transferred on the transfer system;

an emitter that generates and radiates a light onto the test substrate;

a receiver for receiving reflected light from at least one of the plurality of reflective marks on the test substrate;

a controller coupled with the receiver to detect an error in the transfer system based on a reflective time difference of the reflected light received by the receiver, wherein the controller is configured to output the detected error; and a display coupled with the controller that displays the outputted error of the transfer system detected by the controller, wherein the controller measures the reflective time difference when reflective lights are reflected by adjacent reflective marks, and temporarily stores the reflective time difference, wherein the controller compares the temporarily stored reflective time difference with a designated reference reflective time difference to detect an error of the transfer system, wherein if the temporarily stored reflective time difference and the designated reference reflective time difference are substantially the same, the controller determines that the transfer system is a normal state and displays the normal state on the display, and wherein if the temporarily stored reflective time difference is substantially different from the designated reference reflective time difference, the controller determines that the transfer system is in an error state and displays the error state on the display.

2. The apparatus of claim 1, wherein the plurality of reflective marks includes a plurality of first reflective marks and a plurality of second reflective marks that are arranged symmetrically as pairs in a one-to-one relationship on sides of the test substrate, further wherein the distance between each of the pairs is substantially the same.

3. The apparatus of claim 2, wherein the emitter sequentially radiates light into the plurality of first reflective marks and the plurality of second reflective marks.

4. An apparatus for detecting error in a transfer system, comprising:

a test substrate with a plurality of reflective marks, the test substrate being transferred on the transfer system;

an emitter that generates and radiates a light onto the test substrate;

a receiver for receiving the light reflected from at least one of the plurality of reflective marks;

a controller coupled with the receiver to detect an error in the transfer system based on a reflective time difference of the reflective light received by the receiver, wherein the controller outputs the detected error; and a display coupled with the controller that displays the outputted error of the transfer system detected by the controller, wherein the controller measures whether there is a reflective time difference of the light reflected from a first reflective mark and a second reflective mark from the plurality of reflective marks, wherein the controller measures the reflective time difference when reflective lights are reflected by adjacent reflective marks, and temporarily stores the reflective time difference, and wherein the controller compares the temporarily stored reflective time difference with a designated reference reflective time difference to detect an error of the transfer system.

5. The apparatus of claim 4, wherein the plurality of reflective marks includes a plurality of first reflective marks and a plurality of second reflective marks that are arranged in a one-to-one relationship on sides of the test substrate.

6. The apparatus of claim 4, wherein the emitter radiates the light onto the plurality of reflective marks.

7. The apparatus of claim 4, wherein if the reflective time difference is measured, the controller determines that the transfer system is in an error state and displays the error on the display.

8. The apparatus of claim 7, wherein if the reflective time difference is not measured, the controller determines that the transfer system is a normal state and displays the normal state on the display.

9. A method for detecting error in a transfer system, comprising:

radiating a light into a plurality of reflective marks, wherein the plurality of reflective marks are arranged on a test substrate with adjacent reflective marks configured to reflect the light sequentially;

receiving the light reflected by the adjacent reflective marks;

detecting an error in the transfer system based on a reflective time difference of the reflected light from the adjacent reflective marks; and outputting the error detecting result, wherein the reflective time difference is measured and temporarily stored, wherein the temporarily stored reflective time difference is compared with a designated reference reflective time difference to detect the error according to the result, wherein if the temporarily stored reflective time difference and the designated reference reflective time difference are substantially the same, the transfer system is in a normal state, and wherein if the temporarily stored reflective time difference is greater than the designated reference reflective time difference, the error is detected.

10. The method as in claim 9, wherein the outputting of the result is to a display that displays the error of the transfer system.

11. A method for detecting error in a transfer system, comprising:

radiating a light into reflective marks arranged symmetrically on sides of a substrate wherein the substrate includes at least one of the reflective marks on each side of the substrate, the reflective marks are arranged to have a similar distance between adjacent reflective marks on the opposite side of the substrate, wherein the substrate is transferred by the transfer system;

receiving the light reflected by the reflective marks;

measuring a reflective time difference of the reflected light from the reflective marks on the test substrate;

temporarily storing the reflective time difference;

comparing the temporarily stored reflective time difference with a designated reference reflective time difference to detect an error of the transfer system;

detecting the error of the transfer system based on the reflective time difference of the light reflected by first reflective mark and a second reflective mark, wherein the first reflective mark is adjacent to the second reflective mark and located on an opposing side of the substrate from the second reflective mark; and outputting the error detected for the transfer system.

12. The method as in claim 11, wherein if the reflective time difference is measured to be greater than zero, then the transfer system is in an error state.

13. The method as in claim 12, wherein if the reflective time difference is not measured to be greater than zero, the transfer system is a normal state.

14. The method as in claim 11, wherein the step of radiating the light is initiated controlled by a controller in order to illuminate the reflective marks to measure the error in the transfer system.

15. The method as in claim 11, wherein the outputting the error is to a display that displays the error.

* * * * *